United States Patent
Sugiura

(10) Patent No.: US 6,734,554 B2
(45) Date of Patent: May 11, 2004

(54) SEMICONDUCTOR WAFER WITH BUMPS OF UNIFORM HEIGHT

(75) Inventor: Yoshihiro Sugiura, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 10/242,353

(22) Filed: Sep. 13, 2002

(65) Prior Publication Data

US 2003/0052410 A1 Mar. 20, 2003

(30) Foreign Application Priority Data

Sep. 18, 2001 (JP) .................................. 2001-283978
Jul. 31, 2002 (JP) .................................. 2002-223483

(51) Int. Cl.[7] .................. H01L 23/34; B23K 31/02
(52) U.S. Cl. .................. 257/724; 257/738; 257/778; 257/779; 257/780; 257/786; 228/180.22
(58) Field of Search .................. 438/22, 26, 48, 438/106–108, 455, 612, 613, 110, 112, 113, 114, 458, 459, 460, 462; 257/723, 724, 737, 738, 778–780, 786; 228/178, 180.21, 180.22

(56) References Cited

U.S. PATENT DOCUMENTS

| 6,074,896 A | * | 6/2000 | Dando ......................... 438/114 |
| 6,303,470 B1 | * | 10/2001 | Ohsumi et al. ............. 438/462 |
| 6,544,821 B2 | * | 4/2003 | Akram ........................ 438/127 |

FOREIGN PATENT DOCUMENTS

| JP | 2000068271 A | * | 3/2000 | ........ H01L/21/3205 |
| JP | 2000106382 A | * | 4/2000 | ........... H01L/21/60 |
| JP | 2001085457 A | * | 3/2001 | ........... H01L/21/60 |
| JP | 2001223288 A | * | 8/2001 | ........... H01L/23/12 |

* cited by examiner

Primary Examiner—Alonzo Chambliss
(74) Attorney, Agent, or Firm—Oliff & Berridge, PLC

(57) ABSTRACT

A semiconductor wafer has: first semiconductor chips including a side of the semiconductor wafer; second semiconductor chips formed in an area surrounded by the first semiconductor chips, each of the second semiconductor chips having an integrated circuit and pads electrically connected to the integrated circuit; first bumps formed over each of the first semiconductor chips, at least part of each of the first bumps being formed in a columnar shape; and second bumps formed over the pads, respectively, at least part of each of the second bumps being formed in a columnar shape.

27 Claims, 11 Drawing Sheets

SEMICONDUCTOR WAFER WITH BUMPS OF UNIFORM HEIGHT

Japanese Patent Application Nos. 2001-283978 filed on Sep. 18, 2001, and 2002-223483 filed on Jul. 31, 2002 are hereby incorporated by reference in their entirety.

BACKGROUND OF THE INVENTION

The present invention relates to a semiconductor wafer, a semiconductor device and a method of manufacturing the same, a circuit board, and an electronic device.

A bump electrode is useful as an external connecting terminal to reduce a semiconductor package and a semiconductor package disposing area on the substrate. A tape carrier-package utilizing the TAB (Tape Automated Bonding) system and a flip chip structure such as the CSP (Chip Size/Scale Package), etc. are practically used by using the bump electrode.

FIG. 15 is a schematic view of an external connecting portion in a conventional semiconductor chip. A bump is arranged in a pad. The bump is typically constructed by a solder bump and an Au bump. There is an electrolytic plating method as a forming method of this bump.

A patterned wiring layer and pads 510 are formed in a semiconductor wafer 500 forming the bump, and its periphery is coated with a protection film (passivation film) 520 except for an electric connecting area surface of the pad 510. A barrier metal layer and a close attaching metal layer (an under bump metal 530) are laminated on the pad 510 by the sputtering method. Thereafter, an unillustrated resist for bump formation exposing the electric connecting area of the pad and its peripheral portion is formed by the photolithography technique.

Next, a predetermined metal is plated and grown by the electrolytic plating method in accordance with the pattern of the resist. In other words, the semiconductor wafer 500 is dipped into an electrolytic plating liquid, and an electric current flows to the semiconductor wafer 500 through the under bump metal 530. Thus, a predetermined metal for the bump is deposited and grown. Thereafter, the resist is separated and the under bump metal 530 is then wet-etched in accordance with the kind of each layer with the plated and grown metal as a mask. Thereafter, a bump 540 is formed via anneal, etc.

In the electrolytic plating method, it is necessary that no plating height is dispersed on the surface of the semiconductor wafer 500. In other words, the plating height in a chip area near an outer circumferential portion of the semiconductor wafer 500 tends to be high in comparison with that near the center of the semiconductor wafer 500. A portion near the outer circumferential portion of the semiconductor wafer 500 is located at an electric current terminal, and a high electric field might be caused in this portion. When ununiformity of the height of the bump 540 becomes not able, a chip treated as a defective product even in the area of an effective chip is generated. Therefore, the bump 540 of a height exceeding a tolerance in the chip near the outer circumference of the semiconductor wafer 500 was constructed and a measure had to be taken so as not to reduce the effective chip.

BRIEF SUMMARY OF THE INVENTION

A semiconductor wafer in one aspect of the present invention includes a plurality of semiconductor chips, the semiconductor wafer comprising:

first semiconductor chips including a side of the semiconductor wafer;

second semiconductor chips formed in an area surrounded by the first semiconductor chips, each of the second semiconductor chips having at least an integrated circuit and pads electrically connected to the integrated circuit;

first bumps formed over each of the first semiconductor chips, at least part of each of the first bumps being formed in a columnar shape; and second bumps formed over the pads, respectively, at least part of each of the second bumps being formed in a columnar shape.

A semiconductor wafer in another aspect of the present invention includes a plurality of semiconductor chips, the semiconductor wafer comprising:

first semiconductor chips including a side of the semiconductor wafer;

second semiconductor chips formed in an area surrounded by the first semiconductor chips, each of the second semiconductor chips having at least an integrated circuit and pads electrically connected to the integrated circuit;

first bumps formed over each of the first semiconductor chips by a plating method; and second bumps formed over the pads, respectively, by the plating method.

A semiconductor wafer in a further aspect of the present invention includes a plurality of semiconductor chips, the semiconductor wafer comprising:

first semiconductor chips, each of which is surrounded by cutting lines for cutting the semiconductor wafer into individual pieces of the semiconductor chips and by at least part of a side of the semiconductor wafer;

second semiconductor chips, each of which is surrounded by the cutting lines only and has an integrated circuit and pads electrically connected to the integrated circuit;

first bumps formed over each of the first semiconductor chips, at least part of each of the first bumps being formed in a columnar shape; and second bumps formed over the pads, respectively, at least part of each of the second bumps being formed in a columnar shape.

A method of manufacturing a semiconductor device in a still further aspect of the present invention includes:

forming first bumps over each of first semiconductor chips including a side of a semiconductor wafer by a plating method;

forming second bumps over each of second semiconductor chips formed in an area surrounded by the first semiconductor chips, each of the second semiconductor chips having at least an integrated circuit and pads electrically connected to the integrated circuit by a plating method; and cutting the semiconductor wafer into individual pieces of the first semiconductor chips and the second semiconductor chips.

A method of manufacturing a semiconductor device in a still further aspect of the present invention includes:

forming a first mask having first openings over first semiconductor chips including a side of a semiconductor wafer;

forming first bumps over each of the first semiconductor chips by forming a conductive layer at least in each of the first openings;

forming a second mask having second openings over second semiconductor chips formed in an area surrounded by the first semiconductor chips, each of the second semiconductor chips having at least an integrated circuit and pads electrically connected to the integrated circuit;

forming second bumps over each of the second semiconductor chips by forming a conductive layer at least in each of the second openings; and cutting the semiconductor wafer into individual pieces of the first semiconductor chips and the second semiconductor chips.

A method of manufacturing a semiconductor device in a still further the present invention includes:

forming first bumps over each of first semiconductor chips surrounded by cutting lines for cutting a semiconductor wafer into individual pieces of semiconductor chips in a subsequent cutting step and by at least part of a side of the semiconductor wafer;

forming second bumps over each of second semiconductor chips surrounded by the cutting lines only and having an integrated circuit and pads electrically connected to the integrated circuit; and cutting the semiconductor wafer into individual pieces of the first semiconductor chips and the second semiconductor chips.

A semiconductor device in an even further aspect of the present invention is manufactured by the above method.

A circuit board in a yet further aspect the present invention has the above semiconductor device mounted thereon.

An electronic device in an even more further aspect of the present invention has the above semiconductor device.

DETAILED DESCRIPTION OF THE EMBODIMENT

Figure 1:
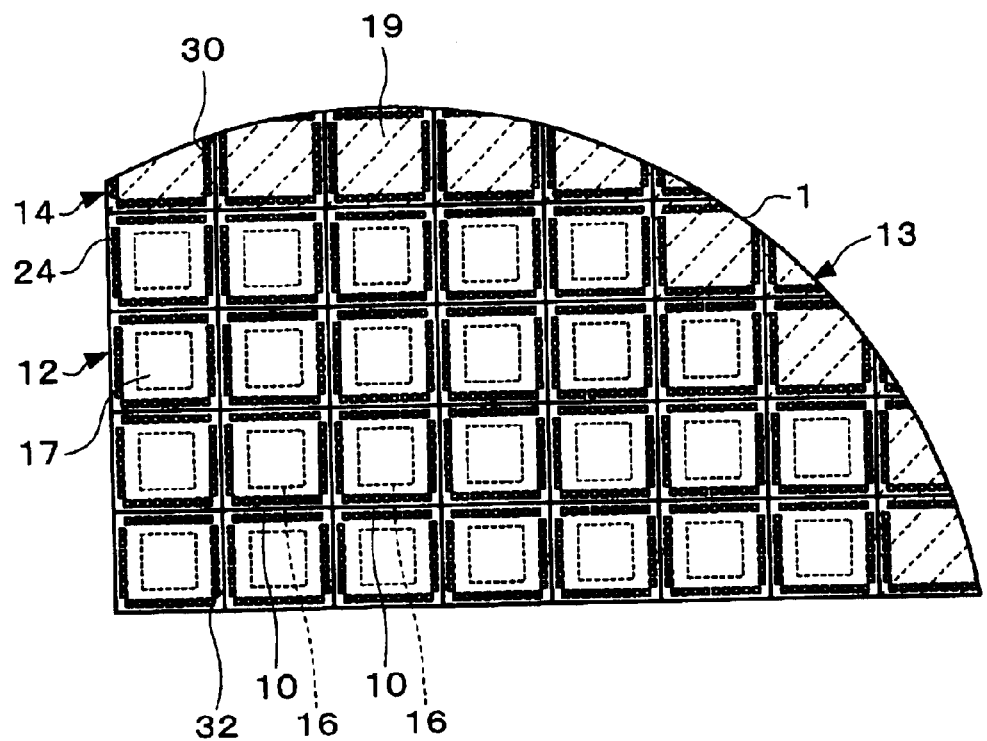
FIG. 1 illustrates a semiconductor wafer in a first embodiment of the present invention.

Embodiments of the present invention may improve the uniformity of a bump height in a semiconductor wafer, a semiconductor device and a method of manufacturing the same, a circuit board, and an electronic device.

(1) A semiconductor wafer in an embodiment of the present invention includes a plurality of semiconductor chips, the semiconductor wafer comprising:

first semiconductor chips including a side of the semiconductor wafer;

second semiconductor chips formed in an area surrounded by the first semiconductor chips, each of the second semiconductor chips having at least an integrated circuit and pads electrically connected to the integrated circuit;

first bumps formed over each of the first semiconductor chips, at least part of each of the first bumps being formed in a columnar shape; and second bumps formed over the pads, respectively, at least part of each of the second bumps being formed in a columnar shape.

In accordance with the embodiment of the present invention, since the first bumps are also formed in the first semiconductor chips, the uniformity of height of the second bumps can be improved in the second semiconductor chips.

(2) A semiconductor wafer in an embodiment of the present invention includes a plurality of semiconductor chips, the semiconductor wafer comprising:

first semiconductor chips including a side of the semiconductor wafer;

second semiconductor chips formed in an area surrounded by the first semiconductor chips, each of the second semiconductor chips having at least an integrated circuit and pads electrically connected to the integrated circuit;

first bumps formed over each of the first semiconductor chips by a plating method; and second bumps formed over the pads, respectively, by the plating method.

In accordance with the embodiment of the present invention, since the first bumps are also formed in the first semiconductor chips, the uniformity of height of the second bumps can be improved in the second semiconductor chips.

(3) A semiconductor wafer in an embodiment of the present invention includes a plurality of semiconductor chips, the semiconductor wafer comprising:

first semiconductor chips, each of which is surrounded by cutting lines for cutting the semiconductor wafer into individual pieces of the semiconductor chips and by at least part of a side of the semiconductor wafer;

second semiconductor chips, each of which is surrounded by the cutting lines only and has an integrated circuit and pads electrically connected to the integrated circuit;

first bumps formed over each of the first semiconductor chips, at least part of each of the first bumps being formed in a columnar shape; and second bumps formed over the pads, respectively, at least part of each of the second bumps being formed in a columnar shape.

In accordance with the embodiment of the present invention, since the first bumps are also formed in the first semiconductor chips, the uniformity of height of the second bumps can be improved in the second semiconductor chips.

(4) The semiconductor wafer may further comprise comprising metallic layers formed over the first semiconductor chips, and the first bumps may be formed over the metallic layers, respectively.

(5) In the semiconductor wafer, the first bumps may be arranged in substantially the same pitch as the second bumps.

(6) In the semiconductor wafer, the first bumps may have substantially the same outer shape as the second bumps.

(7) In the semiconductor wafer, material of the first bumps may have substantially the same composition as material of the second bumps.

(8) In the semiconductor wafer, each of the first semiconductor chips may not have the integrated circuit.

(9) In the semiconductor wafer, the integrated circuit formed in each of the second semiconductor chips may be a monolithic integrated circuit, and a circuit different from the monolithic integrated circuit may be formed in each of the first semiconductor chips.

(10) The semiconductor wafer may further comprise a resin layer which covers the first and second bumps.

(11) A method of manufacturing a semiconductor device in an embodiment of the present invention includes:

forming first bumps over each of first semiconductor chips including a side of a semiconductor wafer by a plating method;

forming second bumps over each of second semiconductor chips formed in an area surrounded by the first semiconductor chips, each of the second semiconductor chips having at least an integrated circuit and pads electrically connected to the integrated circuit by a plating method; and cutting the semiconductor wafer into individual pieces of the first semiconductor chips and the second semiconductor chips.

In accordance with the embodiment of the present invention, since the first bumps are also formed in the first semiconductor chips, the uniformity of height of the second bumps can be improved in the second semiconductor chips.

(12) A method of manufacturing a semiconductor device in an embodiment of the present invention includes:

forming a first mask having first openings over first semiconductor chips including a side of a semiconductor wafer;

forming first bumps over each of the first semiconductor chips by forming a conductive layer at least in each of the first openings;

forming a second mask having second openings over second semiconductor chips formed in an area surrounded by the first semiconductor chips, each of the second semiconductor chips having at least an integrated circuit and pads electrically connected to the integrated circuit;

forming second bumps over each of the second semiconductor chips by forming a conductive layer at least in each of the second openings; and cutting the semiconductor wafer into individual pieces of the first semiconductor chips and the second semiconductor chips.

In accordance with the embodiment of the present invention, since the first bumps are also formed in the first semiconductor chips, the uniformity of height of the second bumps can be improved in the second semiconductor chips.

(13) A method of manufacturing a semiconductor device in an embodiment of the present invention includes:

forming first bumps over each of first semiconductor chips surrounded by cutting lines for cutting a semiconductor wafer into individual pieces of semiconductor chips in a subsequent cutting step and by at least part of a side of the semiconductor wafer;

forming second bumps over each of second semiconductor chips surrounded by the cutting lines only and having an integrated circuit and pads electrically connected to the integrated circuit; and cutting the semiconductor wafer into individual pieces of the first semiconductor chips and the second semiconductor chips.

In accordance with the embodiment of the present invention, since the first bumps are also formed in the first semiconductor chips, the uniformity of height of the second bumps can be improved in the second semiconductor chips.

(14) In the manufacturing method, the step of forming the first bumps and the step of forming the second bumps may be the same step.

(15) In the manufacturing method, the step of forming the first mask and the step of forming the second mask may be the same step.

(16) In the manufacturing method, the first bumps may be formed by an electrolytic plating method in the step of forming the first bumps, and the second bumps may be formed by the electrolytic plating method in the step of forming the second bumps.

(17) In the manufacturing method, the first bumps may be formed by a nonelectrolytic plating method in the step of forming the first bumps, and the second bumps may be formed by the nonelectrolytic plating method in the step of forming the second bumps.

(18) The manufacturing method may further include forming a resin layer so as to cover the first and second bumps before the semiconductor wafer is cut, and the semiconductor wafer may be cut together with the resin layer.

(19) In the manufacturing method, metallic layers formed over the first semiconductor chips may be further provided, and the first bumps may be formed over the metallic layers, respectively.

(20) In the manufacturing method, the first and second bumps may be formed so that the first bumps are arranged in substantially the same pitch as the second bumps, in the step of forming the first and second bumps.

(21) In the manufacturing method, the first and second bumps may be formed so that the first bumps have substantially the same outer shape as the second bumps, in the step of forming the first and second bumps.

(22) In the manufacturing method,
the first and second bumps may be formed so that material of the first bumps has substantially the same composition as material of the second bumps, in the step of forming the first and second bumps.

(23) The semiconductor device in an embodiment of the present invention is manufactured by the above method.

(24) A circuit board in an embodiment of the present invention has the above semiconductor device mounted thereon.

(25) An electronic device in an embodiment of the present invention has the above semiconductor device.

The embodiments of the present invention will be described with reference to the drawings.

First Embodiment

Figure 2:
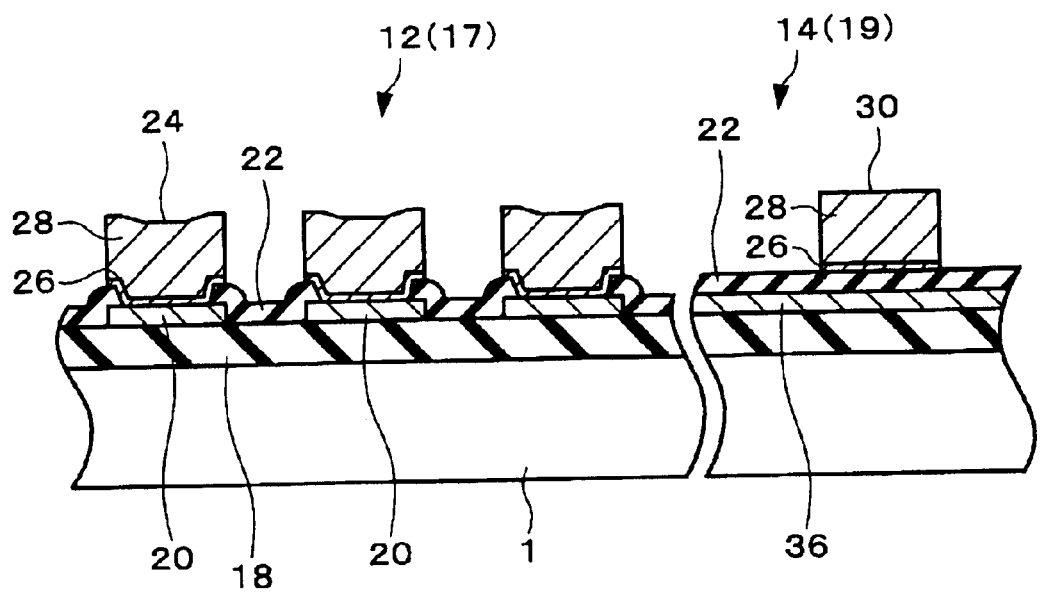
FIG. 2 illustrates the semiconductor wafer in the first embodiment of the present invention.

FIG. 1 illustrates part of a surface of a semiconductor wafer in an embodiment of the present invention. FIG. 2 illustrates part of a cross-section of the semiconductor wafer in the embodiment of the present invention.

The semiconductor wafer 1 is cut (e.g., diced or scribed) into a plurality of semiconductor chips 10. In other words, the semiconductor wafer 1 has the plurality of semiconductor chips 10. These miconductor wafer 1 is cut into individual pieces of the semiconductor chips 10 along a cutting line 32 as individual pieces. The semiconductor wafer 1 has a second area (effective chip area) 12 cut into the plurality of semiconductor chips 10, and a first area 14 (an area shown by the hatching of a broken line in FIG. 1) except for the second area 12. The semiconductor chips 10 include semiconductor chips 17 (second semiconductor chip) located in the second area 12, and semiconductor chips 19 (first semiconductor chip) located in the first area 14. The first area 14 includes the semiconductor chips 19 at least partly having a side 13 of the semiconductor wafer 1. The semiconductor chip 19 may also be surrounded by the side 13 of the semiconductor wafer 1 and the cutting lines 32. The second area 12 may also be an area surrounded by the first area 14. In other words, the semiconductor chips 17 may be arranged in the area surrounded by the semiconductor chips 19. The second area 12 may also include the semiconductor chips 17 surrounded by only the cutting lines 32. The cutting line 32 is the boundary line between two adjacent semiconductor chips 10. When the semiconductor wafer 1 is cut into individual pieces of the semiconductor chips 10, the semiconductor wafer 1 may also be cut along this cutting lines 32. The second area 12 may also include an area cut and removed at the time of cutting. The second area 12 may also be a central area of the semiconductor wafer. The first area 14 may also be an area outside the second area 12. The first area 14 may also be an area surrounding the second area 12. The first area 14 may also be an end portion area of the semiconductor wafer 1. The width of the first area 14 may be narrower than the width of the second area 12. In this case, the first area 14 is an area unable to include an area required to form the semiconductor chips 10. Otherwise, the first area 14 may also be an area able to include the area required to form the semiconductor chips 10 so as to secure quality.

The semiconductor wafer 1 has a plurality of integrated circuits (e.g., monolithic integrated circuits) 16. Each integrated circuit 16 is arranged to realize the function of each semiconductor chip 10. The integrated circuit 16 is formed in the semiconductor chip 17 of at least the second area 12. In this embodiment, a circuit (e.g., an integrated circuit) may be formed in the semiconductor chip 19 of the first area 14, or may not be formed in the semiconductor chip 19.

As shown in FIG. 2, a plurality of pads 20 are formed on an insulating layer 18 in the semiconductor wafer 1. The pads 20 of one group are electrically connected to one of the integrated circuits 16. In other words, the pad 20 is part of (e.g., an end portion) wiring electrically connected to the integrated circuit 16. The pad 20 may be formed by aluminum.

A passivation film (protection film) 22 is formed in the semiconductor wafer 1. The passivation film 22 is formed so as to avoid at least a central portion of each pad 20. In other words, the passivation film 22 has an opening on each pad 20. The area of the opening of the passivation film 22 may be smaller than the area of an upper face of each pad 20. The passivation film 22 may cover an end portion (e.g., a peripheral edge portion) of each pad 20. The passivation film 22 may also be formed so as to avoid the cutting line (e.g., a dicing line or a scribe line) 32. The passivation film 22 can be formed by an insulating layer of resin of $SiO_2$, SiN, polyimide, etc. The passivation film 22 may be constructed by a single layer of these insulating layers, and may also be formed by a plurality of layers constructed by laminating these insulating layers.

A second bump 24 is formed over the pad 20. The second bump 24 is formed over an exposed surface from the passivation film 22 of the pad 20. The second bump 24 may also be formed so that this second bump 24 is located on an end portion (above the peripheral edge portion of the bad 20) of the opening of the passivation film 22. In this case, there is a case in which the upper face of the second bump 24 is recessed in its central portion and is risen in its peripheral edge portion. The second bump 24 may also be called an electrode portion for external connection. The second bump 24 may also be a bump formed by a plating method. The second bump 24 may also be a so-called straight wall bump formed in a columnar shape.

The second bump 24 may be formed by a plurality of layers (e.g., first and second layers 26 and 28). The first layer 26 may be a metallic layer known as an under bump metal. The first layer 26 may also be a layer for preventing a material (a conductive layer such as a metal, etc.) constituting the second layer 28 on the first layer 26 from being diffused into the semiconductor wafer 1, a layer for preferably holding a close attaching property to the material (a conductive material such as a metal, etc.) constituting the second layer 28 on the first layer 26, or a layer formed by laminating these layers. The second layer 28 may be formed by gold, solder or nickel, etc.

A first bump 30 is formed in the first area 14. The first bump 30 may be formed by the same material (the same material in at least design) as the second bump 24. Similar to the second bump 24, the first bump 30 may be formed by a plurality of layers (e.g., first and second layers 26 and 28). The arranging pitch of the second bump 24 and the arranging pitch of the first bump 30 may be approximately equal to each other, and the second bump 24 and the first bump 30 may also be designed in at least the same shape. The shape (e.g., planar shape) of the second bump 24 and the shape (e.g., planar shape) of the first bump 30 may be approximately equal to each other, and may also be designed in at least the same shape. Further, the outer shape of the second bump 24 and the outer shape of the first bump 30 may be approximately the same shape. The same outer shape means that the sectional shapes (the shape of a section horizontal to the surface of the semiconductor chip 10 at the same height seen from the surface of the semiconductor chip 10) of the second bump 24 and the first bump 30 are approximately the same. In accordance with this construction, uniformity of the second bump 24 arranged on the surface of the semiconductor wafer 10 can be improved. The first bump 30 may be a bump formed by the plating method. Further, the first bump 30 may also be a so-called straight wall bump formed in a columnar shape.

In this embodiment, the first bump 30 is formed on the passivation film 22. A metallic layer 36 is formed in the first area 14. The metallic layer 36 maybe formed by the same material as the pad 20. In the first area 14, the metallic layer 36 is covered with the passivation film 22.

Figure 3A:
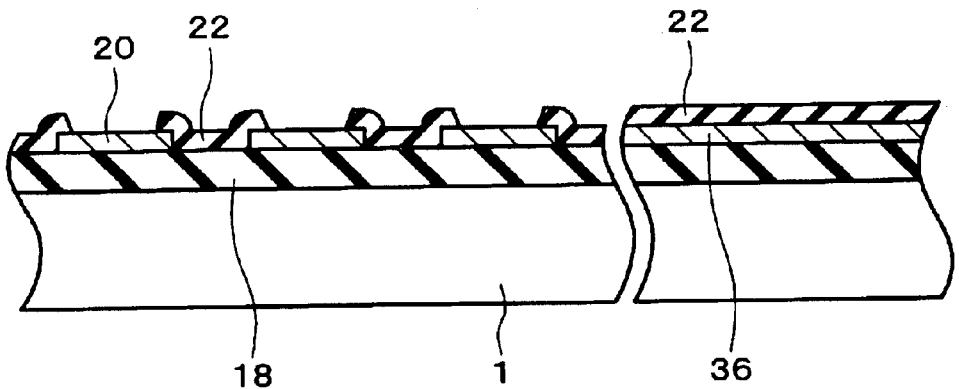
FIGS. 3A to 3C describe the manufacturing method of a semiconductor device in the first embodiment of the present invention.

FIGS. 3A to 5B describe the manufacturing method of the semiconductor device in the first embodiment of the present invention. For example, a semiconductor wafer 1 in a state shown in FIG. 3A is prepared. The semiconductor wafer 1 has a plurality of semiconductor chips 10 which include a semiconductor chip 17 including a plurality of integrated circuits 16 and also include a semiconductor chip 19. At least the semiconductor chip 17 has a pad electrically connected to the integrated circuit 16.

Figure 3B:
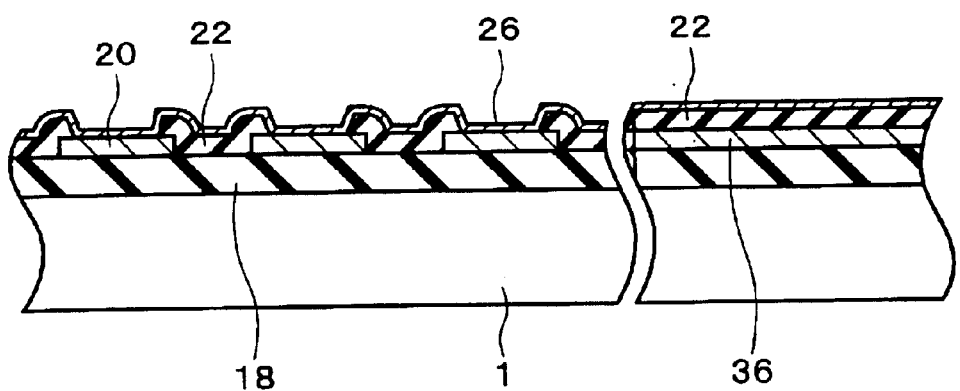

In this embodiment, first and second bumps 30 and 24 are formed by electrolytic plating. For example, as shown in FIG. 3B, a first conductive layer 26 is formed. The first conductive layer 26 is formed by a conductive material. The first conductive layer 26 is formed on at least the pad 20. The first conductive layer 26 may also be formed so as to electrically connect a plurality of pads 20. The first conductive layer 26 may also be formed so as to electrically connect the plurality of pads 20 arranged in the plurality of semiconductor chips 10. The first conductive layer 26 may also be integrally arranged from above the pad 20 in the second area 12 to above the insulating film 22 in the first area 14 or above the metallic layer 36. The first conductive layer 26 may also be formed so as to cover the plurality of pads 20. The first conductive layer 26 may also be formed on the entire forming face of the pad 20 of the semiconductor wafer 1. The first conductive layer 26 shown in FIG. 3B is the same as the first conductive layer 26 shown in FIG. 2 except for its shape.

Figure 3C:
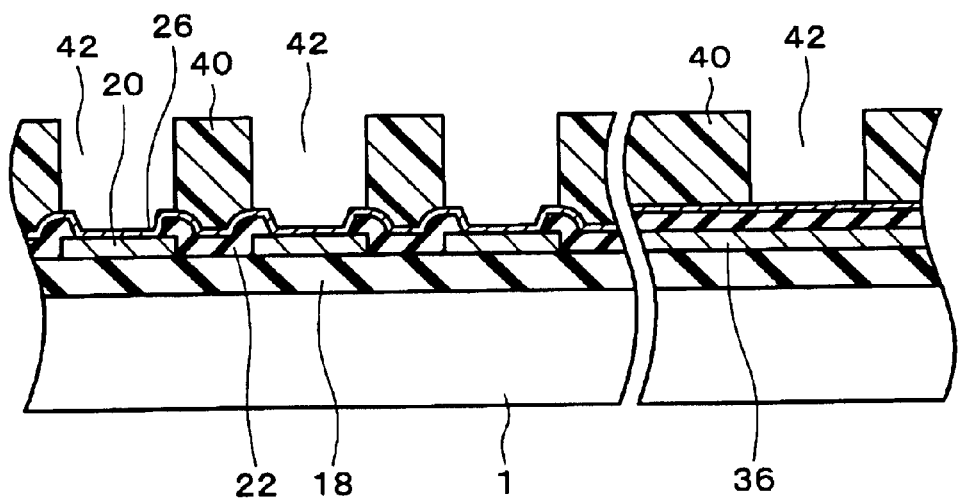
Figure 4:
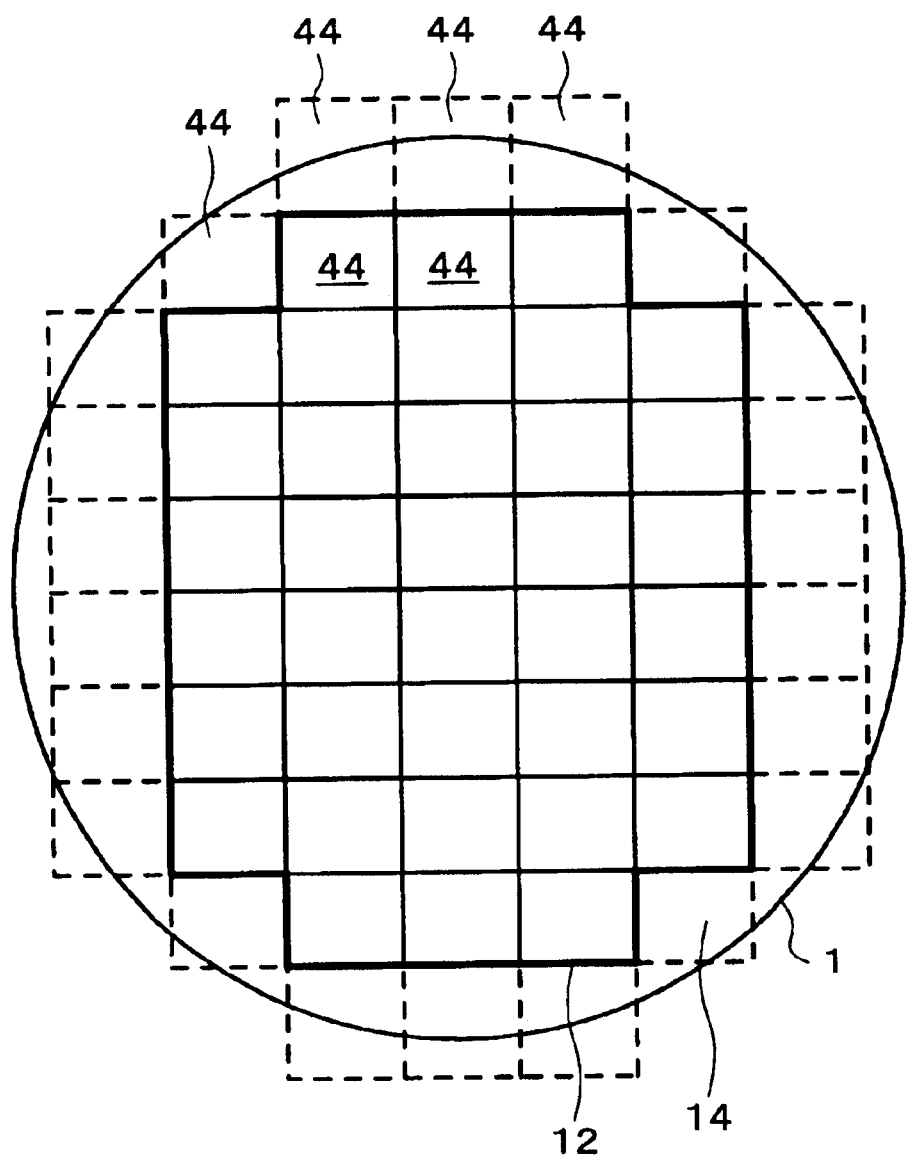
FIG. 4 describes the manufacturing method of the semiconductor device in the first embodiment of the present invention.

As shown in FIG. 3C, a patterned resist layer 40 is formed. An opening 42 corresponding to the first and second bumps 30 and 24 is formed in the resist layer 40. The first and second bumps 30 and 24 are formed within the opening 42. In the resist layer 40, a photosensitive resin layer may be patterned by applying photolithography. For example, when a stepper is used, as shown in FIG. 4, an unillustrated reticle (mask) is used and an exposure area 44 is stepped and exposure is repeated. The exposure area 44 may be projected from the first area 14. In accordance with this construction, since the exposure of the first area 14 is also performed by the reticle for the exposure of the second area 12, it is not necessary to prepare a new reticle so that manufacture cost of the semiconductor device can be restrained.

Figure 5A:
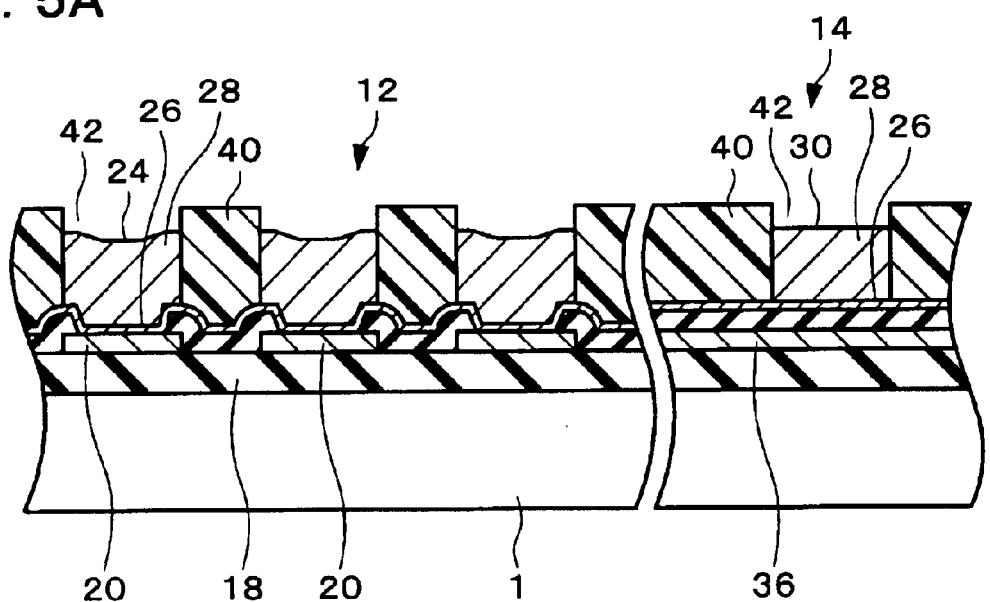
FIGS. 5A to 5B describe the manufacturing method of the semiconductor device in the first embodiment of the present invention.

As shown in FIG. 5A, electrolytic plating is then performed. More particularly, the semiconductor wafer 1 is dipped into an electrolytic plating liquid, and an electric current is flowed between an unillustrated electrode within the electrolytic plating liquid and the first conductive layer 26. Thus, a metal is deposited and grown on the first conductive layer 26 within the opening 42 of the resist layer 40, and the second conductive layer 28 can be formed.

Here, the first area 14 for forming the first bump 30 is an end portion (e.g., a terminal) of an area for performing the electrolytic plating. Accordingly, the second area 12 becomes a central portion of the area for performing the electrolytic plating so that uniformity of the plating growth of the second bump 24 is improved. In other words, the uniformity of the plating growth is improved in the second area 12 by increasing the plating growth in the first area 14. In this embodiment, the height of the second bump 24 is uniformed.

Figure 5B:
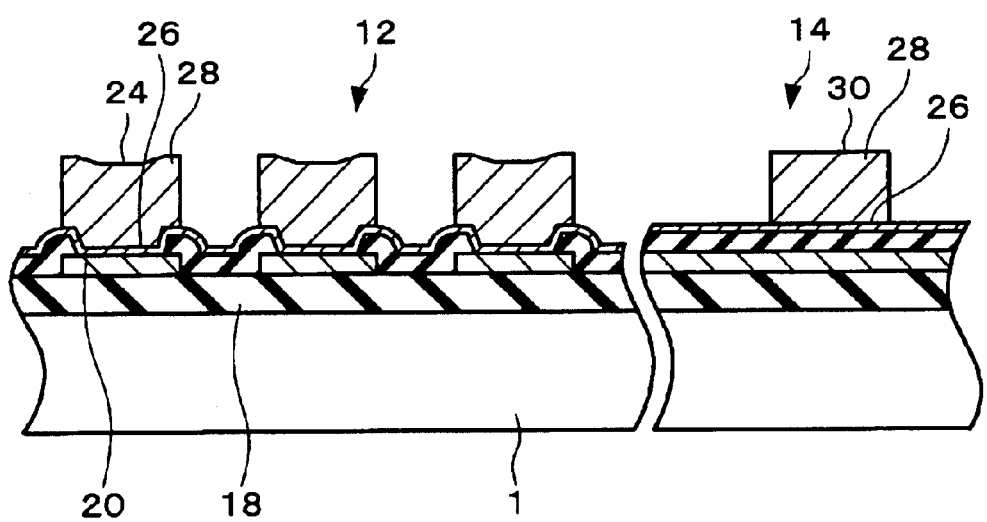

Next, the resist layer 40 is removed as shown in FIG. 5B. The first layer 26 is etched and removed with the first and second bumps 30 and 24 as masks. Thus, as shown in FIG. 2, the first layer 26 is patterned. In this embodiment, the first and second bumps 30 and 24 are formed in the same step. Contents able to be derived from the structure of the above semiconductor wafer 1 are pertinent to the manufacturing method of the semiconductor device.

Figure 6:
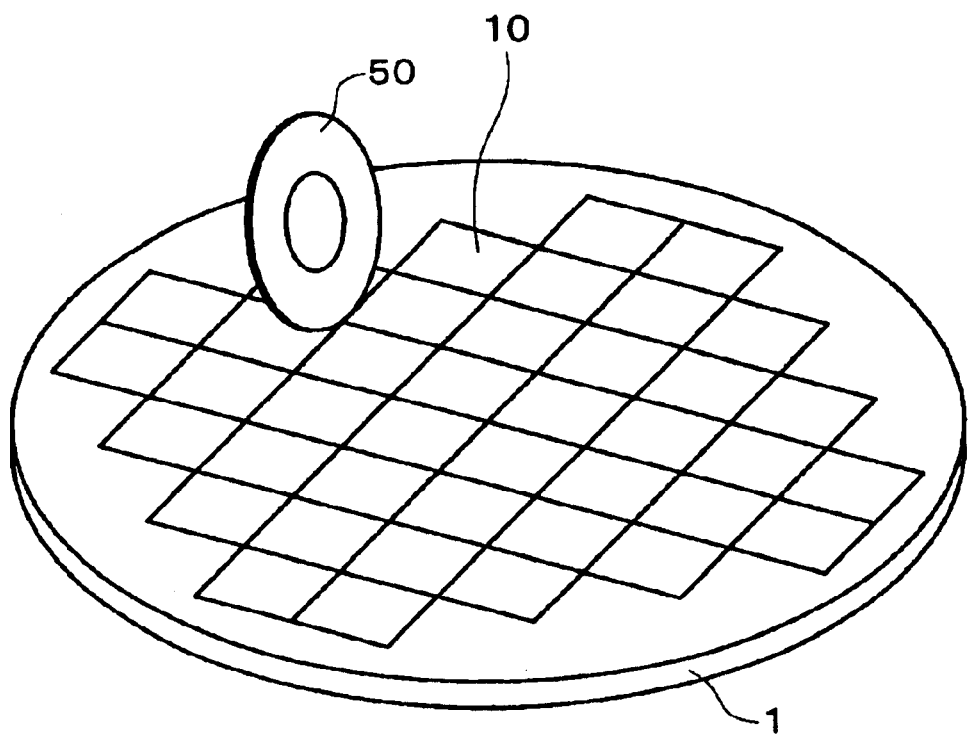
FIG. 6 describes the manufacturing method of the semiconductor device in the first embodiment of the present invention.

As shown in FIG. 6, the individual semiconductor chip 10 can be obtained by cutting the semiconductor wafer 1 by a tool (a cutter or a scriber such as a dicer, etc.) 50.

In this embodiment, the first and second bumps 30 and 24 are formed by the electrolytic plating, but may also be formed by nonelectrolytic plating in the present invention.

Second Embodiment

Figure 7:
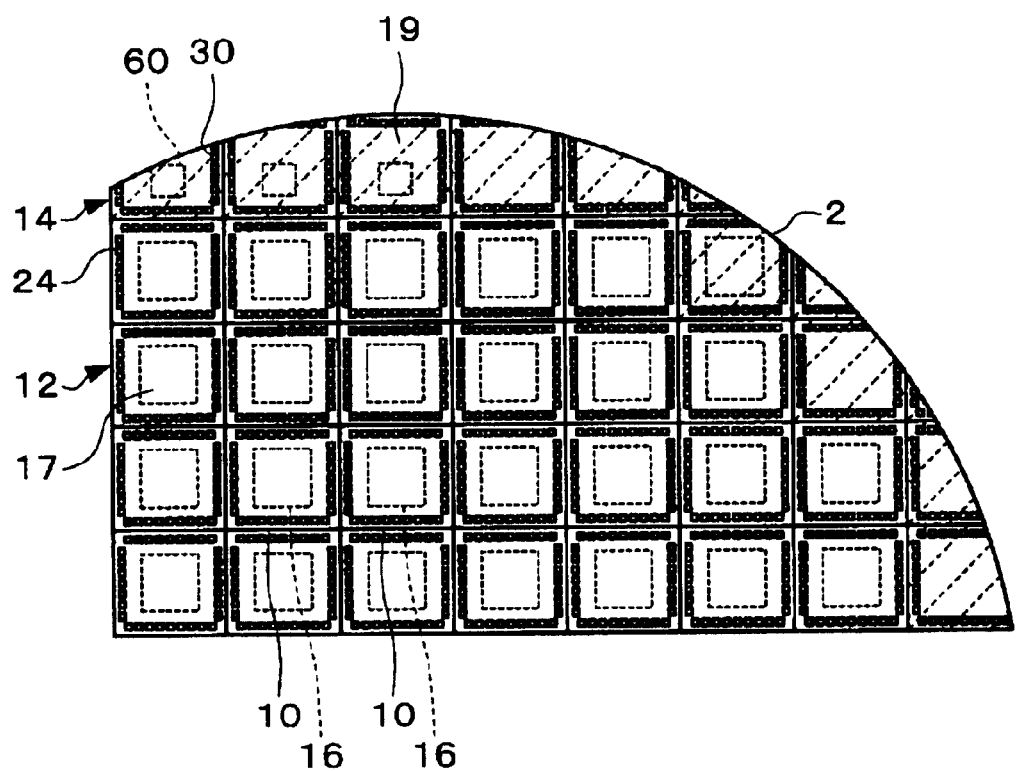
FIG. 7 illustrates a semiconductor wafer in a second embodiment of the present invention.

FIG. 7 illustrates a semiconductor wafer 2 in a second embodiment of the present invention. This semiconductor wafer 2 differs from the semiconductor wafer 1 in the first embodiment in that a circuit (e.g., an integrated circuit) 60 is formed within a semiconductor chip 19 of a first area 14. The circuit 60 may also be a circuit different from one perfect monolithic integrated circuit. In this case, the circuit 60 may be part of (e.g., an imperfect circuit) an integrated circuit 16 formed in a second area 12, and may also be an inspecting circuit. The contents described in the first embodiment are pertinent to the other contents. Similar to the semiconductor chip 17, pads may also be formed in the semiconductor chip 19 of the first area 14. In this case, a first bump 30 is arranged over the pad.

Third Embodiment

Figure 8:
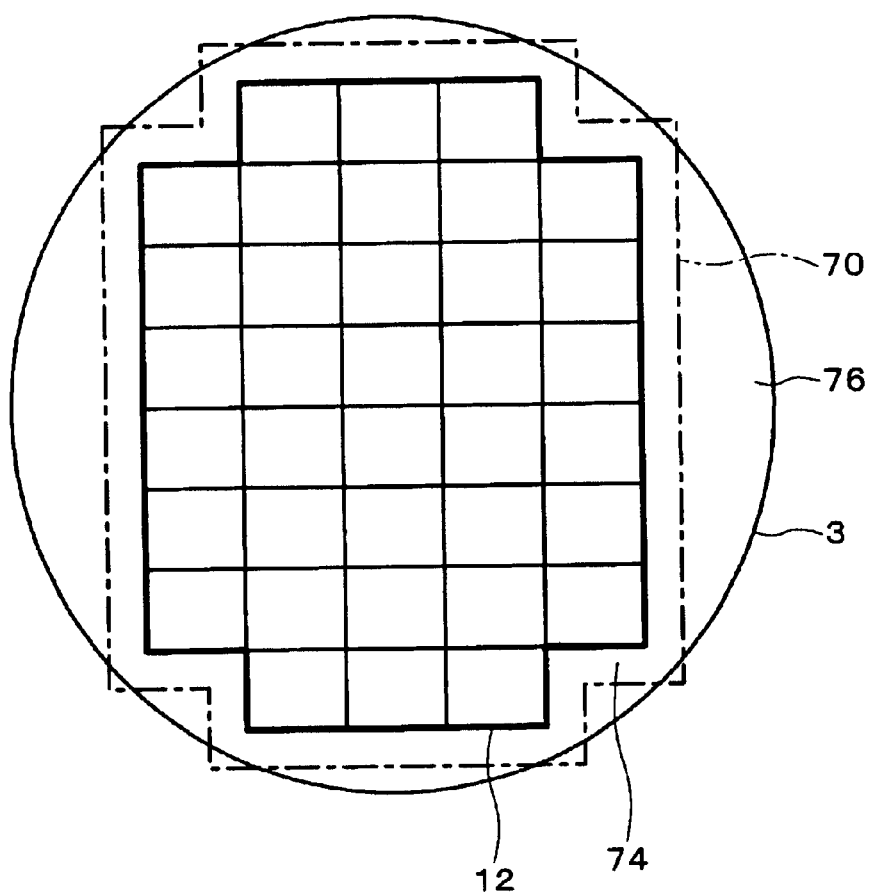
FIG. 8 describes the manufacturing method of a semiconductor device in a third embodiment of the present invention.

FIG. 8 describes the manufacturing method of a semiconductor device in a third embodiment of the present invention. In this embodiment, a dedicated mask is used in patterning a resist layer used to form the first and second bumps. An exposure area 70 using the dedicated mask includes first and second areas 74 and 12. In accordance with this construction, the resist layer is collectively exposed and can be patterned. Further, in accordance with this construction, since the exposure area 70 is narrower than a semiconductor wafer 3, there is an unexposed area 76 in the semiconductor wafer 3. In other words, in this embodiment, no bump is formed in an end portion of the semiconductor wafer 3. The contents described in the first and second embodiments are pertinent to the other contents.

Fourth Embodiment

Figure 9:
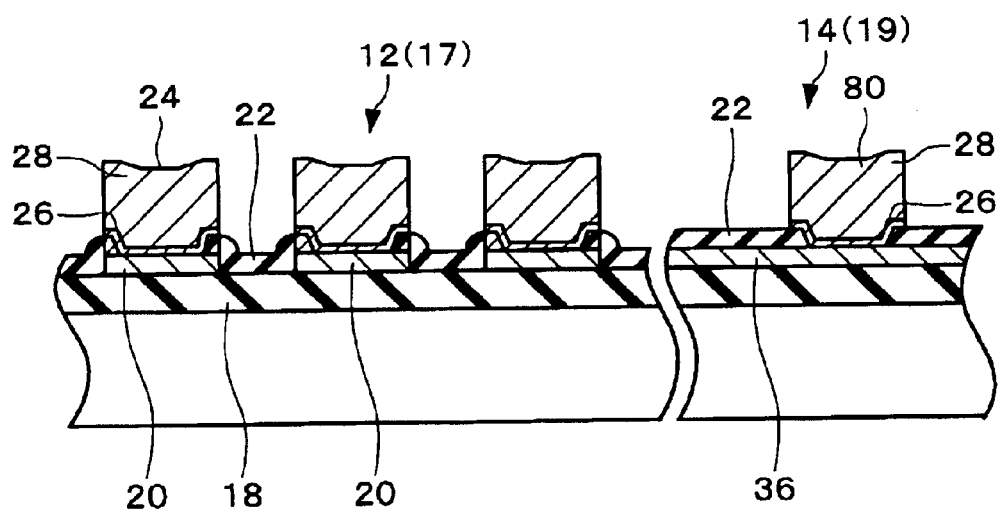
FIG. 9 illustrates a semiconductor wafer in a fourth embodiment of the present invention.

FIG. 9 illustrates a semiconductor wafer in a fourth embodiment of the present invention. In this embodiment, an opening of a passivation film 22 is also formed in a first area 14 at a position for forming a first bump 80. A first layer 26 is formed on an opening end portion of the passivation film 22, and is also formed on a metallic layer 36 within the opening. The first bump 80 is formed on the metallic layer 36. The contents described in the first to third embodiments are pertinent to the other contents.

Fifth Embodiment

Figure 10A:
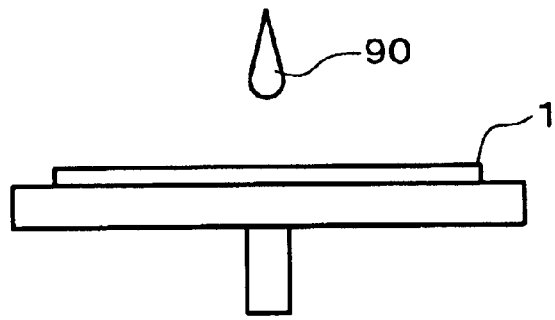
FIGS. 10A to 10D describe a semiconductor wafer and the manufacturing method of a semiconductor device in a fifth embodiment of the present invention.

FIGS. 10A to 10D describe a semiconductor wafer and the manufacturing method of a semiconductor device in a fifth embodiment of the present invention. In this embodiment, as shown in FIG. 10A, resin 90 is formed in the semiconductor wafer 1 having the first and second bumps 30 and 24 described in the first embodiment. The resin 90 is formed so as to cover the first and second bumps 30 and 24. As this covering method, there are a spin coat method, a dispensing method from a dispenser, etc. The resin 90 may also be coated on the semiconductor wafer 1. The resin 90 may also be constructed by one of an insulating adhesive, a conductive adhesive or an anisotropic conductive adhesive. The resin 90 may also be set to thermoplastic resin.

Figure 10B:
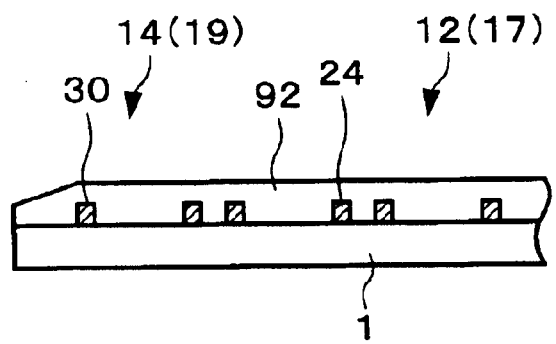

As shown in FIG. 10B, a resin layer 92 is formed by the resin 90. As mentioned above, a first bump 30 is formed in a first area 14 outside a second area 12. Accordingly, no resin layer 92 is thinned even in the first area 14 above the first bump 30. Therefore, the thickness of the resin layer 92 can be uniformed in the second area 12. The resin layer 92 may also be thinned in an end portion of the semiconductor wafer 1.

Figure 10C:
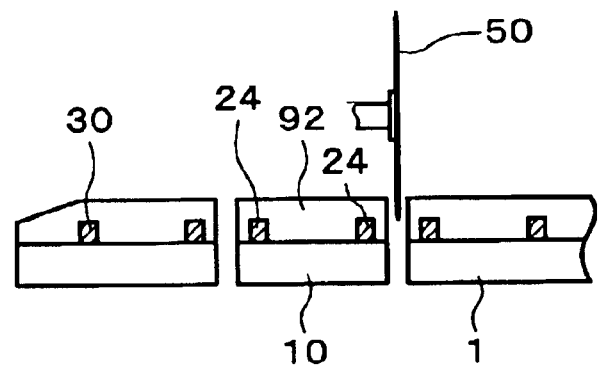

As shown in FIG. 10C, the semiconductor wafer 1 is cut by a tool (a cutter or a scriber such as a dicer, etc.) 50 together with the resin layer 92. Thus, a semiconductor chip 10 can be obtained. The resin layer 92 is formed in the semiconductor chip 10. Since the resin layer 92 has the uniform thickness on the second area 12 of the semiconductor wafer 1, the thicknesses of an end portion and a central portion of the resin layer 92 on the semiconductor chip 10 are also uniformed.

Figure 10D:
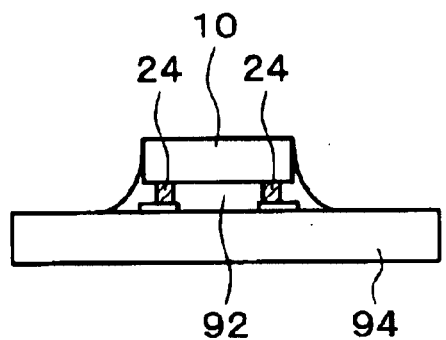

As shown in FIG. 10D, the semiconductor chip 10 is disposed on a substrate (a circuit board as a mother board or an interposer within the semiconductor device) 94 by using flip chip bonding method. The semiconductor chip 10 can be fixed to the substrate 94 by the resin layer 92. Since the thicknesses of the end portion and the central portion of the resin layer 92 on the semiconductor chip 10 are uniformed, it is possible to prevent an adhesive defect and an electric connection defect with respect to the substrate 94.

Other Embodiments

Figure 11:
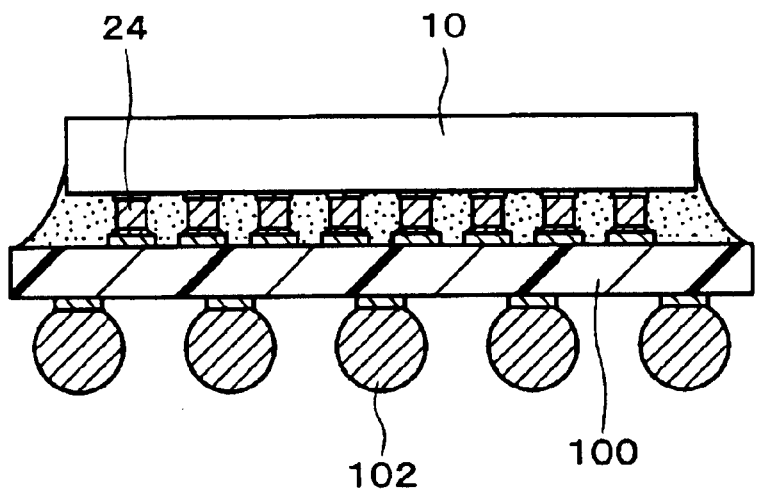
FIG. 11 illustrates the semiconductor device in the embodiment of the present invention.

FIG. 11 shows the semiconductor device manufactured by the above method. The semiconductor device has the semiconductor chip 10 and the semiconductor chip 10 has the second bump 24. The semiconductor chip 10 is disposed on a substrate 100. The resin layer 92 described in the fifth embodiment may also be used in order to seal the semiconductor chip 10 on the substrate 100. An external terminal (solder ball) 102 is arranged in the substrate 100.

Figure 12:
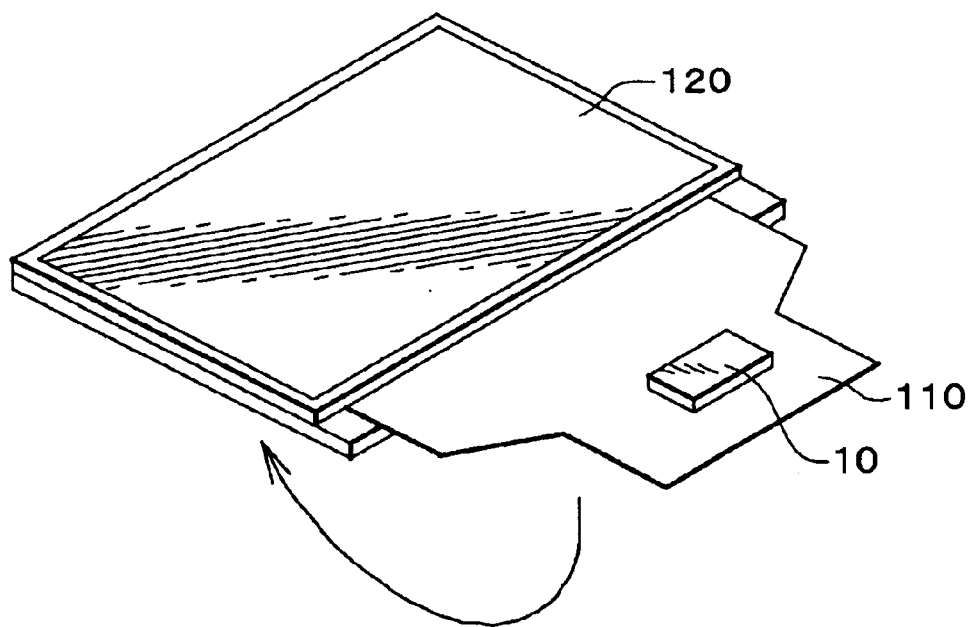
FIG. 12 illustrates the semiconductor device in the embodiment of the present invention.

FIG. 12 shows the semiconductor device manufactured by the above method. The semiconductor device constitutes a TCP (Tape Carrier Package) by bonding the semiconductor chip 10 to a substrate 110. This semiconductor device is joined to an electronic panel (e.g., a liquid crystal panel and an electro-luminescence panel) 120.

Figure 13:
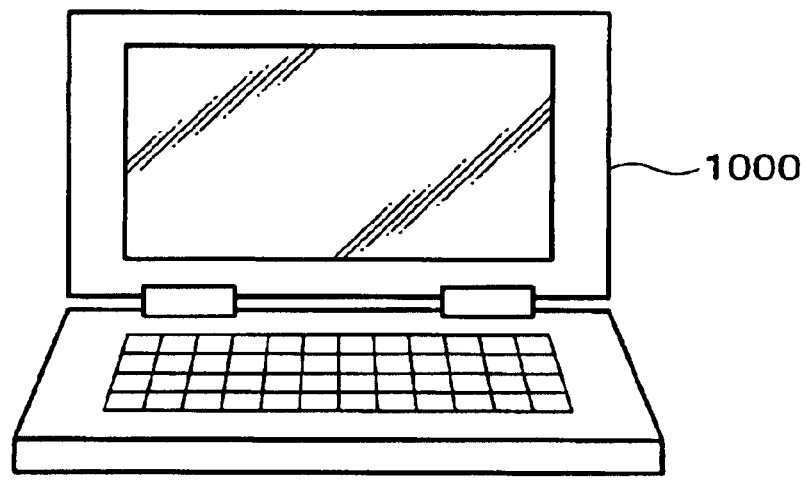
FIG. 13 illustrates an electronic device having the semiconductor device in the embodiment of the present invention.
Figure 14:
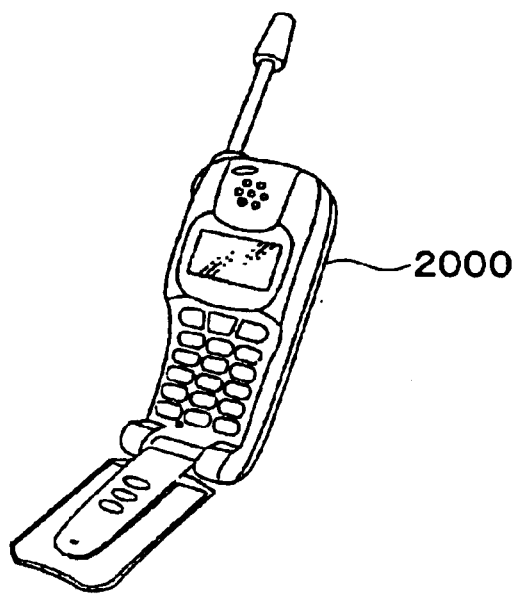
FIG. 14 illustrates the electronic device having the semiconductor device in the embodiment of the present invention.
Figure 15:
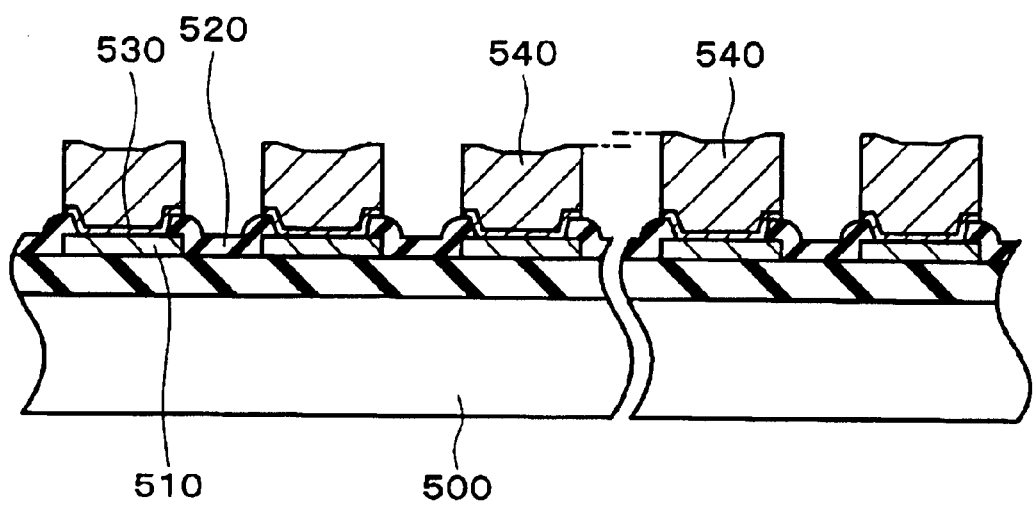
FIG. 15 illustrates the prior art of the present invention.

FIG. 13 shows a notebook personal computer 1000 and FIG. 14 shows a portable telephone 2000 as an electronic device having the semiconductor device applying the present invention thereto.

The present invention is not limited to the above embodiments, but can be variously modified. For example, the present invention includes the substantially same construction (e.g., the same construction in function, method and result, or the same construction in object and result) as the construction described in the embodiments. Further, the present invention includes a construction in which an unessential element of the construction described in the embodiments is replaced. Further, the present invention includes a construction having the same operating effect as the construction described in the embodiments, or a construction able to achieve the same object. Further, the present invention includes a construction in which a publicly known technique is added to the construction described in the embodiments.

What is claimed is:

1. A semiconductor wafer including a plurality of semiconductor chips, the semiconductor wafer comprising:

first semiconductor chips including a side of the semiconductor wafer;

second semiconductor chips formed in an area surrounded by the first semiconductor chips, each of the second semiconductor chips having at least an integrated circuit and pads electrically connected to the integrated circuit;

first bumps formed over each of the first semiconductor chips without a pad, at least part of each of the first bumps being formed in a columnar shape; and second bumps formed over the pads, respectively, at least part of each of the second bumps being formed in a columnar shape.

2. The semiconductor wafer as defined in claim 1, further comprising metallic layers formed over the first semiconductor chips, wherein the first bumps are formed over the metallic layers, respectively.

3. The semiconductor wafer as defined in claim 1, wherein the first bumps are arranged in substantially the same pitch as the second bumps.

4. The semiconductor wafer as defined in claim 1, wherein the first bumps have substantially the same outer shape as the second bumps.

5. The semiconductor wafer as defined in claim 1, wherein material of the first bumps has substantially the same composition as material of the second bumps.

6. The semiconductor wafer as defined in claim 1, wherein each of the first semiconductor chips does not have the integrated circuit.

7. The semiconductor wafer as defined in claim 1, wherein the integrated circuit formed in each of the second semiconductor chips is a monolithic integrated circuit, and wherein a circuit different from the monolithic integrated circuit is formed in each of the first semiconductor chips.

8. The semiconductor wafer as defined in claim 1, further comprising a resin layer which covers the first and second bumps.

9. The semiconductor wafer as defined in claim 1, further comprising a passivation film formed over the first semiconductor chips, wherein the first bumps are formed on the passivation film.

10. A semiconductor wafer including a plurality of semiconductor chips, the semiconductor wafer comprising:

first semiconductor chips including a side of the semiconductor wafer;

second semiconductor chips formed in an area surrounded by the first semiconductor chips, each of the second semiconductor chips having at least an integrated circuit and pads electrically connected to the integrated circuit;

first bumps formed over each of the first semiconductor chips without a pad by a plating method; and second bumps formed over the pads, respectively, by the plating method.

11. The semiconductor wafer as defined in claim 10, further comprising metallic layers formed over the first semiconductor chips, wherein the first bumps are formed over the metallic layers, respectively.

12. The semiconductor wafer as defined in claim 10, wherein the first bumps are arranged in substantially the same pitch as the second bumps.

13. The semiconductor wafer as defined in claim 10, wherein the first bumps have substantially the same outer shape as the second bumps.

14. The semiconductor wafer as defined in claim 10, wherein material of the first bumps has substantially the same composition as material of the second bumps.

15. The semiconductor wafer as defined in claim 10, wherein each of the first semiconductor chips does not have the integrated circuit.

16. The semiconductor wafer as defined in claim 10, wherein the integrated circuit formed in each of the second semiconductor chips is a monolithic integrated circuit, and wherein a circuit different from the monolithic integrated circuit is formed in each of the first semiconductor chips.

17. The semiconductor wafer as defined in claim 10, further comprising a resin layer which covers the first and second bumps.

18. The semiconductor wafer as defined in claim 10, further comprising a passivation film formed over the first semiconductor chips, wherein the first bumps are formed on the passivation film.

19. A semiconductor wafer including a plurality of semiconductor chips, the semiconductor wafer comprising:

first semiconductor chips, each of which is surrounded by cutting lines for cutting the semiconductor wafer into individual pieces of the semiconductor chips and by at least part of a side of the semiconductor wafer;

second semiconductor chips, each of which is surrounded by the cutting lines only and has an integrated circuit and pads electrically connected to the integrated circuit;

first bumps formed over each of the first semiconductor chips without a pad, at least part of each of the first bumps being formed in a columnar shape; and second bumps formed over the pads, respectively, at least part of each of the second bumps being formed in a columnar shape.

20. The semiconductor wafer as defined in claim 19, further comprising metallic layers formed over the first semiconductor chips, wherein the first bumps are formed over the metallic layers, respectively.

21. The semiconductor wafer as defined in claim 19, wherein the first bumps are arranged in substantially the same pitch as the second bumps.

22. The semiconductor wafer as defined in claim 19, wherein the first bumps have substantially the same outer shape as the second bumps.

23. The semiconductor wafer as defined in claim 19, wherein material of the first bumps has substantially the same composition as material of the second bumps.

24. The semiconductor wafer as defined in claim 19, wherein each of the first semiconductor chips does not have the integrated circuit.

25. The semiconductor wafer as defined in claim 19, wherein the integrated circuit formed in each of the second semiconductor chips is a monolithic integrated circuit, and wherein a circuit different from the monolithic integrated circuit is formed in each of the first semiconductor chips.

26. The semiconductor wafer as defined in claim 19, further comprising a resin layer which covers the first and second bumps.

27. The semiconductor wafer as defined in claim 19, further comprising a passivation film formed over the first semiconductor chips, wherein the first bumps are formed on the passivation film.

\* \* \* \* \*